US010687003B2

(12) United States Patent
Mabuchi et al.

(10) Patent No.: US 10,687,003 B2
(45) Date of Patent: Jun. 16, 2020

(54) LINEAR-LOGARITHMIC IMAGE SENSOR

(71) Applicant: OMNIVISION TECHNOLOGIES, INC., Santa Clara, CA (US)

(72) Inventors: Keiji Mabuchi, Los Altos, CA (US); Dyson H. Tai, San Jose, CA (US); Oray Orkun Cellek, Santa Cruz, CA (US); Duli Mao, Sunnyvale, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 133 days.

(21) Appl. No.: 15/228,874

(22) Filed: Aug. 4, 2016

(65) Prior Publication Data

US 2018/0041723 A1   Feb. 8, 2018

(51) Int. Cl.
*H04N 5/355*   (2011.01)
*H04N 5/369*   (2011.01)
(Continued)

(52) U.S. Cl.
CPC ... *H04N 5/35518* (2013.01); *H01L 27/14607* (2013.01); *H01L 27/14612* (2013.01);
(Continued)

(58) Field of Classification Search
CPC ......... H01L 27/14607; H01L 27/14612; H01L 27/14621; H01L 27/14627; H04N 5/3745; H04N 5/378; H04N 9/045
(Continued)

(56) References Cited

U.S. PATENT DOCUMENTS 7,489,352 B2 * 2/2009 Nakamura ......... H04N 5/35554
348/216.1
8,754,452 B2   6/2014 Sakano et al.
(Continued)

FOREIGN PATENT DOCUMENTS

EP   1354360 A1   10/2003
JP   2013-187727 A   9/2013

OTHER PUBLICATIONS

Taiwanese Office Action and Translation dated Sep. 28, 2018, for Taiwanese Application No. 106125989, filed Aug. 2, 2017, 11 pages.
(Continued)

*Primary Examiner* — Sinh Tran
*Assistant Examiner* — Zhenzhen Wu
(74) *Attorney, Agent, or Firm* — Christensen O'Connor Johnson Kindness PLLC (57) ABSTRACT

A pixel array for use in a high dynamic range image sensor includes a plurality of pixels arranged in a plurality of rows and columns in the pixel array. Each one of the pixels includes a linear subpixel and a log subpixel disposed in a semiconductor material. The linear subpixel is coupled to generate a linear output signal having a linear response, and the log subpixel is coupled to generate a log output signal having a logarithmic response in response to the incident light. A bitline is coupled to the linear subpixel and to the log subpixel to receive the linear output signal and the log output signal. The bitline is one of a plurality of bitlines coupled to the plurality of pixels. Each one of the plurality of bitlines is coupled to a corresponding grouping of the plurality of pixels.

20 Claims, 4 Drawing Sheets

(51) Int. Cl.
*H01L 27/146* (2006.01)
*H04N 5/3745* (2011.01)
*H04N 9/04* (2006.01)
*H04N 5/378* (2011.01)

(52) U.S. Cl.
CPC .. *H01L 27/14621* (2013.01); *H01L 27/14627* (2013.01); *H04N 5/3696* (2013.01); *H04N 5/3745* (2013.01); *H04N 9/045* (2013.01); *H04N 5/378* (2013.01)

(58) Field of Classification Search
USPC ............... 348/273, 272, 294, 302; 250/208.1
See application file for complete search history.

(56) References Cited

U.S. PATENT DOCUMENTS

| | | |
|---|---|---|
| 8,917,341 B2 | 12/2014 | Sakano et al. |
| 9,117,728 B2 | 8/2015 | Sakano et al. |
| 9,602,745 B2 | 3/2017 | Nishihara |
| 9,674,531 B2 | 6/2017 | Gamei et al. |
| 9,686,547 B2 | 6/2017 | Gamei et al. |
| 9,686,548 B2 | 6/2017 | Gamei et al. |
| 9,693,058 B2 | 6/2017 | Gamei et al. |
| 9,769,406 B2 | 9/2017 | Sakano |
| 9,826,231 B2 | 11/2017 | Gamei et al. |
| 9,948,929 B2 | 4/2018 | Gamei et al. |
| 10,412,329 B2 | 9/2019 | Sakano et al. |
| 2005/0077588 A1 | 4/2005 | Kasuga |
| 2006/0274171 A1* | 12/2006 | Wang ................... G06K 7/14 348/294 |
| 2008/0252762 A1 | 10/2008 | Iwamoto et al. |
| 2009/0200451 A1* | 8/2009 | Conners ............... H04N 5/2351 250/208.1 |
| 2012/0074299 A1 | 3/2012 | Ni |
| 2012/0211642 A1* | 8/2012 | Iwamoto ............ H04N 5/35509 250/208.1 |
| 2013/0242147 A1* | 9/2013 | Lee ................... H01L 27/14603 348/262 |
| 2014/0160327 A1* | 6/2014 | Enoki ................... H01L 27/307 348/294 |
| 2015/0189211 A1 | 7/2015 | Kokumai et al. |
| 2015/0288900 A1* | 10/2015 | Lee ................... H04N 5/35527 348/222.1 |
| 2017/0359537 A1* | 12/2017 | Sakano ............. H01L 27/14601 |
| 2018/0048836 A1* | 2/2018 | Sakano ............. H04N 5/35563 |

OTHER PUBLICATIONS

ROC (Taiwan) Patent Application No. 106125989—Office Action with English Translation dated Jul. 2, 2019, 14 pages.

* cited by examiner

LINEAR-LOGARITHMIC IMAGE SENSOR

BACKGROUND INFORMATION

Field of the Disclosure

The present invention relates generally to imaging, and more specifically, the present invention is directed to high dynamic range image sensors.

Background

Image sensors have become ubiquitous. They are widely used in digital still cameras, cellular phones, security cameras, as well as, medical, automobile, and other applications. The technology used to manufacture image sensors, such as for example complementary metal-oxide-semiconductor (CMOS) image sensors (CIS), has continued to advance at a great pace. For example, the demands for higher resolution and lower power consumption have encouraged the further miniaturization and integration of these image sensors.

High dynamic range (HDR) image sensors have become useful for many applications. In general, ordinary image sensors, including for example charge coupled device (CCD) and CMOS image sensors (CIS), have a dynamic range of approximately 70 dB dynamic range. In comparison, the human eye has a dynamic range of up to approximately 100 dB. There are a variety of situations in which an image sensor having an increased dynamic range is beneficial. For example, image sensors having a dynamic range of more than 100 dB dynamic range are needed in variety of industries. For instance, in the automotive industry HDR image sensors are needed in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One typical solution to provide HDR images is to combine multiple exposures captured with normal CMOS image sensors to provide a single HDR image. However, multiple exposures consume memory and power in the camera system, and present other challenges with regard to the artifacts that are caused by capturing the multiple exposures of fast moving objects. Although logarithmic sensors may provide the benefit of increased dynamic range, logarithmic sensors suffer from poor low light performance and require special complex algorithms compared to images sensors that utilize normal CMOS image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Examples in accordance with the teaching of the present invention describe a high dynamic range image sensor with a pixel array with pixels that include linear subpixels and log subpixels disposed in semiconductor material. Each linear subpixel of each pixel is coupled to generate a linear output signal having a linear response in response to incident light, and each log subpixel of each pixel is coupled to generate a log output signal having a logarithmic response in response to the incident light. A bitline is coupled to the linear subpixel and to the log subpixel to receive the linear output signal and the log output signal from each pixel.

Figure 1:
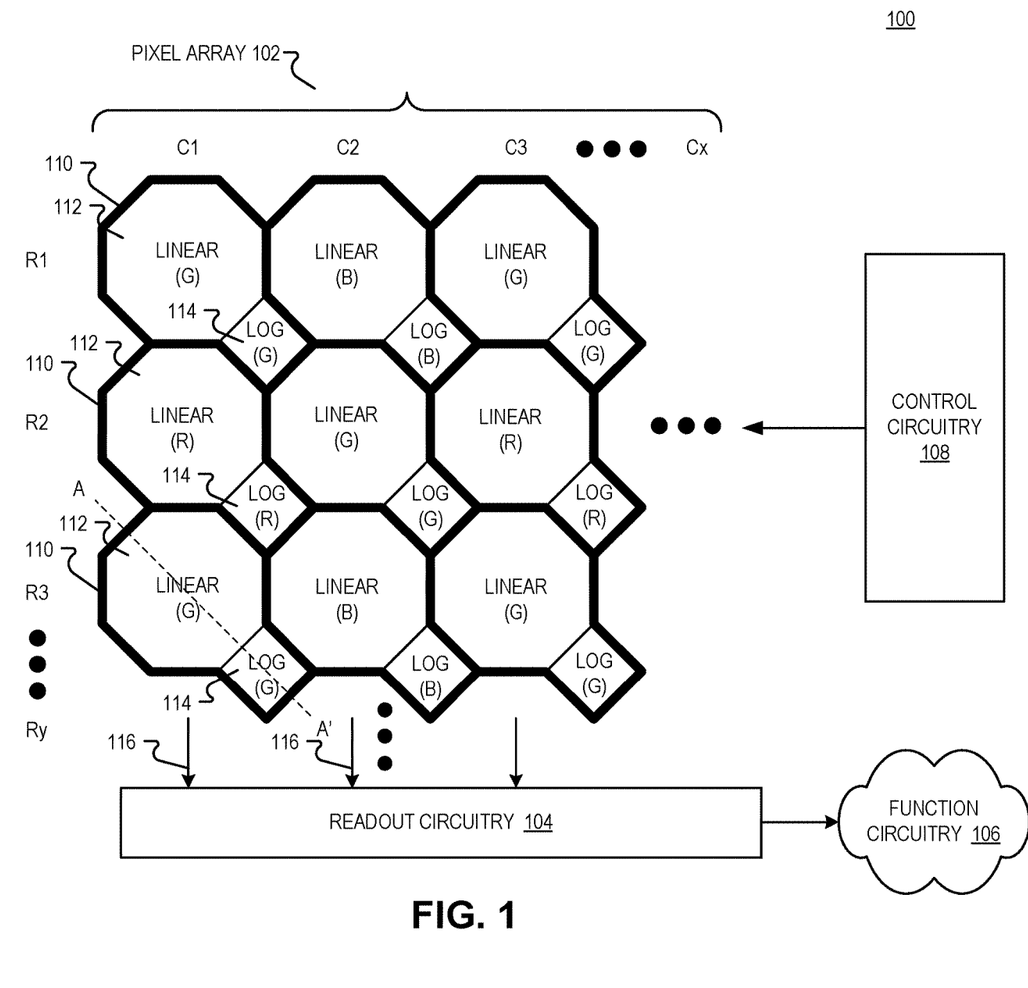
FIG. 1 is a diagram illustrating one example of an imaging system including an example HDR image sensor with linear-logarithmic pixels in accordance with the teachings of the present invention.

To illustrate, FIG. 1 is a diagram that shows generally one example of an HDR imaging system 100 including an example pixel array 102 of pixels 110. As shown in the example, each one of the pixels 110 may be an HDR pixel that includes one linear subpixel 112 and one log subpixel 114. Accordingly, the ratio of the number of linear subpixels 112 to the number of log subpixels 114 in each pixel 110, and therefore the ratio of the number of linear subpixels 112 to the number of log subpixels 114 in the pixel array 102, is 1:1. In the example, pixel array 102 is a two-dimensional (2D) array of CMOS imaging sensors comprised of pixels 110 arranged into a plurality of rows and columns. In particular, the depicted example shows that each pixel 110 is arranged into a row (e.g., rows R1 to Ry) and a column (e.g., column C1 to Cx) to acquire image data of a person, place, object, etc., which can then be used to render an image of the person, place, object, etc. As such, each pixel 110, and therefore each linear subpixel 112 and log subpixel 114 are arranged in a square lattice pattern, as shown in the depicted example.

In one example, each linear subpixel 112 is coupled to generate a linear output signal having a linear response in response to incident light, and each log subpixel 114 is coupled to generate a log output signal having a logarithmic response in response to the incident light. As shown in the depicted example, the log subpixel 114 has a smaller light exposure area compared to the light exposure area of linear subpixel 112 of the pixel 110.

In the specific example illustrated in FIG. 1, HDR imaging system 100 is a color imaging system, and pixel array 102 therefore includes a color filter array having color filters disposed over each pixel 110. In the example, each one of the pixels 110 has a same color filter disposed over the linear subpixel 112 and the log subpixel 114. In other words, if the linear subpixel 112 of a pixel 110 has a red (R) color filter, the corresponding log subpixel 114 of the pixel 110 has the same color red (R) color filter. In the specific example depicted in FIG. 1, a Bayer pattern of red (R), green (G), and blue (B) color filters are arranged over pixels 110 for explanation purposes. It is appreciated that in other examples, the color filters of the color filter array may be arranged into other patterns, such as an EXR pattern, X-trans pattern, or the like. In other examples, the color filters may include infrared filters, ultraviolet filters, other light filters that isolate invisible portions of the EM spectrum, or no color filters at all in the case of a monochromatic image sensor.

In one example, after each pixel 110 has acquired its image data or image charge, the image data included in the linear and log output signals are read out by readout circuitry 104 through bitlines 116 and then transferred to function circuitry 106. In the example, each bitline 116 is coupled to a linear subpixel 112 and to a log subpixel 114 of each pixel 110 in a corresponding column (e.g., column C1 to Cx) of pixels of the pixel array 102 to receive the linear output signal and the log output signal from each linear subpixel 112 and each log subpixel 114.

In various examples, readout circuitry 104 may include amplification circuitry, analog-to-digital (ADC) conversion circuitry, or otherwise. Function circuitry 106 may include logic to simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
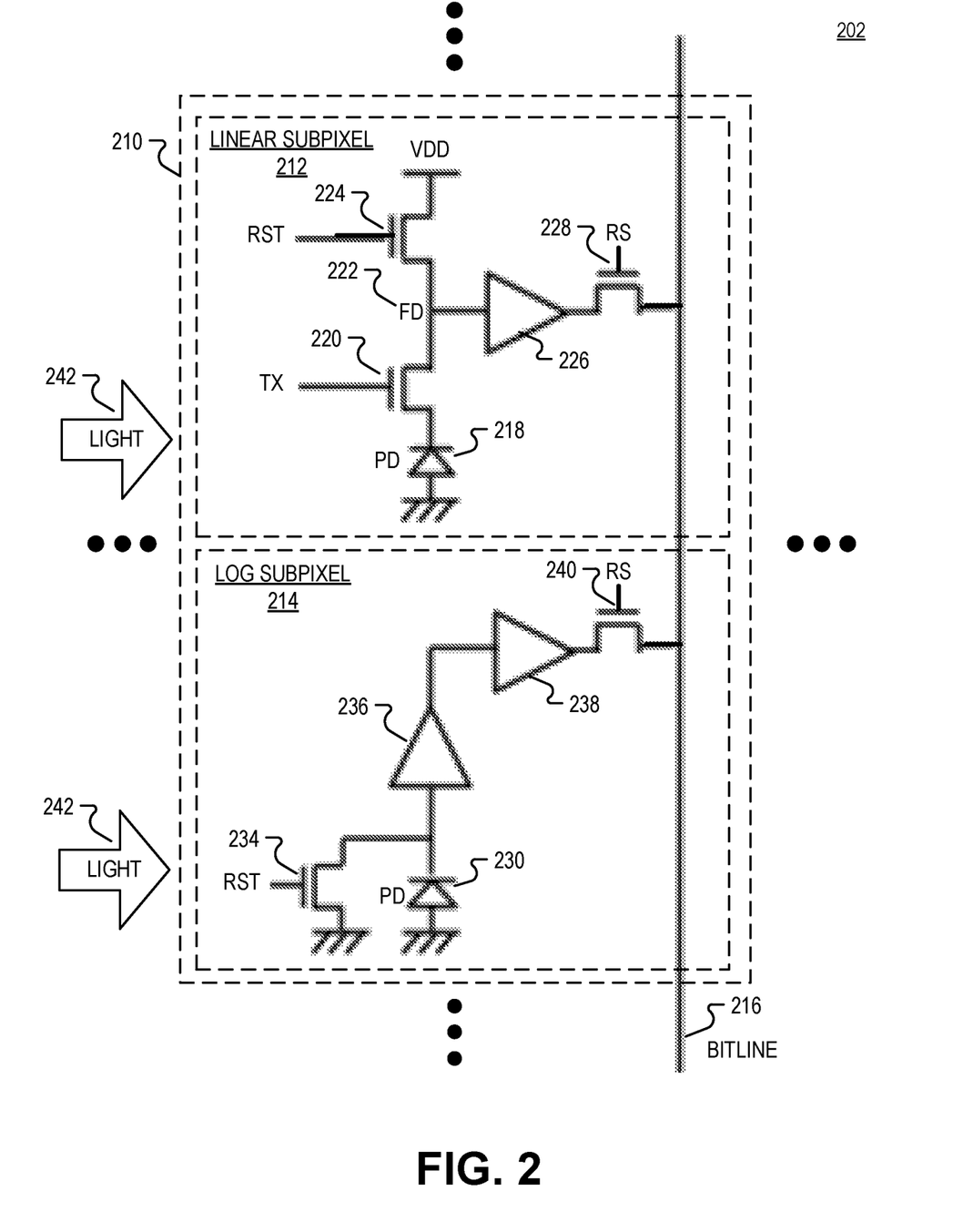
FIG. 2 is a schematic illustration one example of HDR pixel circuitry of an image sensor including a pixel having a linear subpixel and a logarithmic subpixel in accordance with the teachings of the present invention.

FIG. 2 is a schematic illustrating one example of a pixel 210 including a linear subpixel 212 and a log subpixel 214 included in a pixel array 202 in accordance with the teachings of the present invention. In one example, it is appreciated that pixel 210 may be an example of one of the plurality of pixels 110 included in the example pixel array 102 of the HDR image sensor 100 illustrated above in FIG. 1, and that similarly named and numbered elements referenced below are coupled and function similar to as described above. In addition, it is appreciated that the schematic of pixel 210, including linear subpixel 212 and log subpixel 214 are provided for explanation purposes and therefore represent just one possible example architecture for implementing each pixel within pixel array 102 of FIG. 1, and that examples in accordance with the teachings of the present invention are not limited to specific pixel architectures. Indeed, one of ordinary skill in the art having the benefit of the instant disclosure will understand that the present teachings are applicable to 3T, 4T, 5T, and other logarithmic designs, as well as various other suitable pixel architectures in accordance with the teachings of the present invention.

As shown in the example depicted in FIG. 2, the linear subpixel 212 and log subpixel 214 of pixel 210 are coupled to bitline 216. Linear subpixel 212 includes a first photodiode (PD) 218 coupled to photogenerate image charge in response to incident light 242. In one example, a transfer transistor 220 is coupled to transfer the image charge photogenerated in the first photodiode 218 to a floating diffusion 222 in response to a transfer TX signal. A reset transistor 224 is coupled to a voltage (e.g., VDD) to reset the floating diffusion 222 and the first photodiode 218 in response to a reset RST signal. An amplifier 226 has an input coupled to floating diffusion 222 to generate the linear output signal having a linear response in response to incident light 242. The linear output signal is output to bitline 216 through a row select transistor 228 in response to a row select RS signal.

The example of log subpixel 214 illustrated in FIG. 2 includes a second photodiode (PD) 230 coupled to photogenerate image charge in response to incident light 242. In one example, a reset transistor 234 coupled to a reference voltage (e.g., ground) to reset the second photodiode 230 in response the reset RST signal. In the example, an input of an amplifier 236 is coupled to the second photodiode 230, and an amplifier 238 is coupled to an output of amplifier 236 to generate the log output signal at an output of amplifier 238 having a logarithmic response in response to incident light 242. The log output signal is output to bitline 216 through a row select transistor 240 in response to the row select RS signal.

Figure 3:
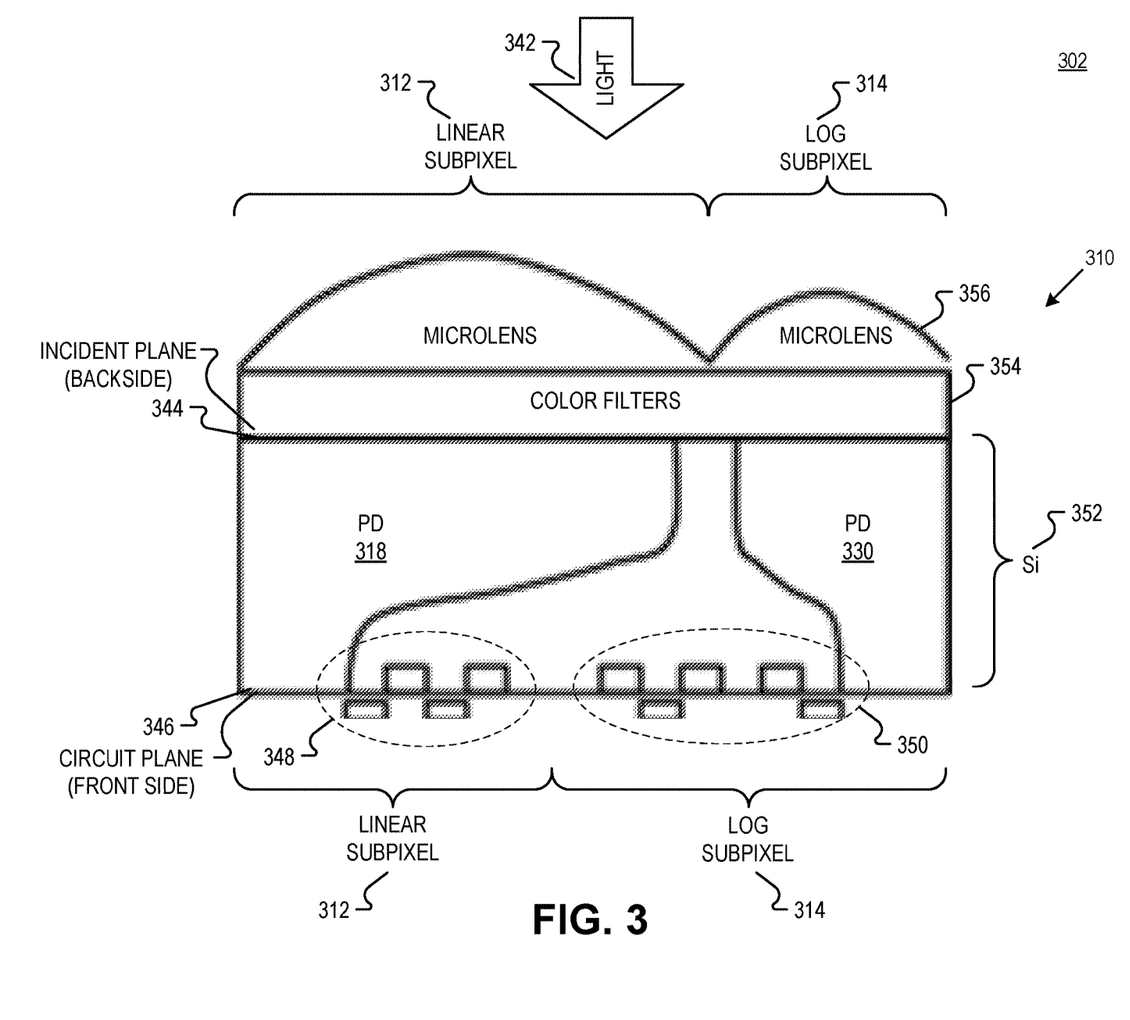
FIG. 3 is a cross section illustration of one example of HDR pixel circuitry of pixel array including a pixel having a linear subpixel and a log subpixel in accordance with the teachings of the present invention.

FIG. 3 is a cross section illustration of a semiconductor chip including one example of HDR pixel circuitry of pixel array 302 including a pixel 310 having a linear subpixel 312 and a log subpixel 314 in accordance with the teachings of the present invention. In one example, it is appreciated that pixel 310, linear subpixel 312, and log subpixel 314 may be examples of pixel 110, linear subpixel 112, and log subpixel 114 illustrated above in FIG. 1 and/or pixel 210, linear subpixel 212, and log subpixel 214 illustrated above in FIG. 2, and that similarly named and numbered elements referenced below are coupled and function similar to as described above. For instance, it is noted that the cross section illustration example depicted in FIG. 3 may correspond to a cross section along dashed lines A-A' through pixel array 102 illustrated in the example depicted in FIG. 1.

As shown in the example depicted in FIG. 3, the linear subpixel 312 includes a first photodiode (PD) 318 is disposed in the semiconductor material 352, and the log subpixel 314 includes a second photodiode (PD) 330 disposed in the semiconductor material 352. In one example, semiconductor material 352 includes silicon (Si) or another suitable semiconductor material. As shown in the depicted example, the first and second photodiodes 318 and 330 are illuminated with the incident light 342 that is directed through an incident plane proximate to the backside 344 of the semiconductor material 352. As shown in the example, the exposure area occupied by the first photodiode 318 of linear subpixel 312 is greater than the exposure area occupied by the second photodiode 330 of log subpixel 314 on the incident plane on the backside 344 of semiconductor material 352. In one example, it is noted that incident light 342 may be directed through microlenses 356 when directed to first and second photodiodes 318 and 330 through backside 344 of semiconductor material 352. In a color image sensor example, it is noted that incident light 342 may also be directed through color filters 354 when directed to first and second photodiodes 318 and 330 through backside 344 of semiconductor material 352.

In the example depicted in FIG. 3, it is noted that elements of the linear subpixel support circuitry 348 and the log subpixel support circuitry 350 are also illustrated in a circuit plane of semiconductor material 352. In one example, the circuit plane of semiconductor material 352 is proximate to a front side 346 of semiconductor material 352 as shown. In the example, the linear subpixel support circuitry 348 is coupled to the first photodiode 318 to help generate the linear output signal, and the log subpixel support circuitry 350 is coupled to the second photodiode 330 to help generate the log output signal.

Figure 4:
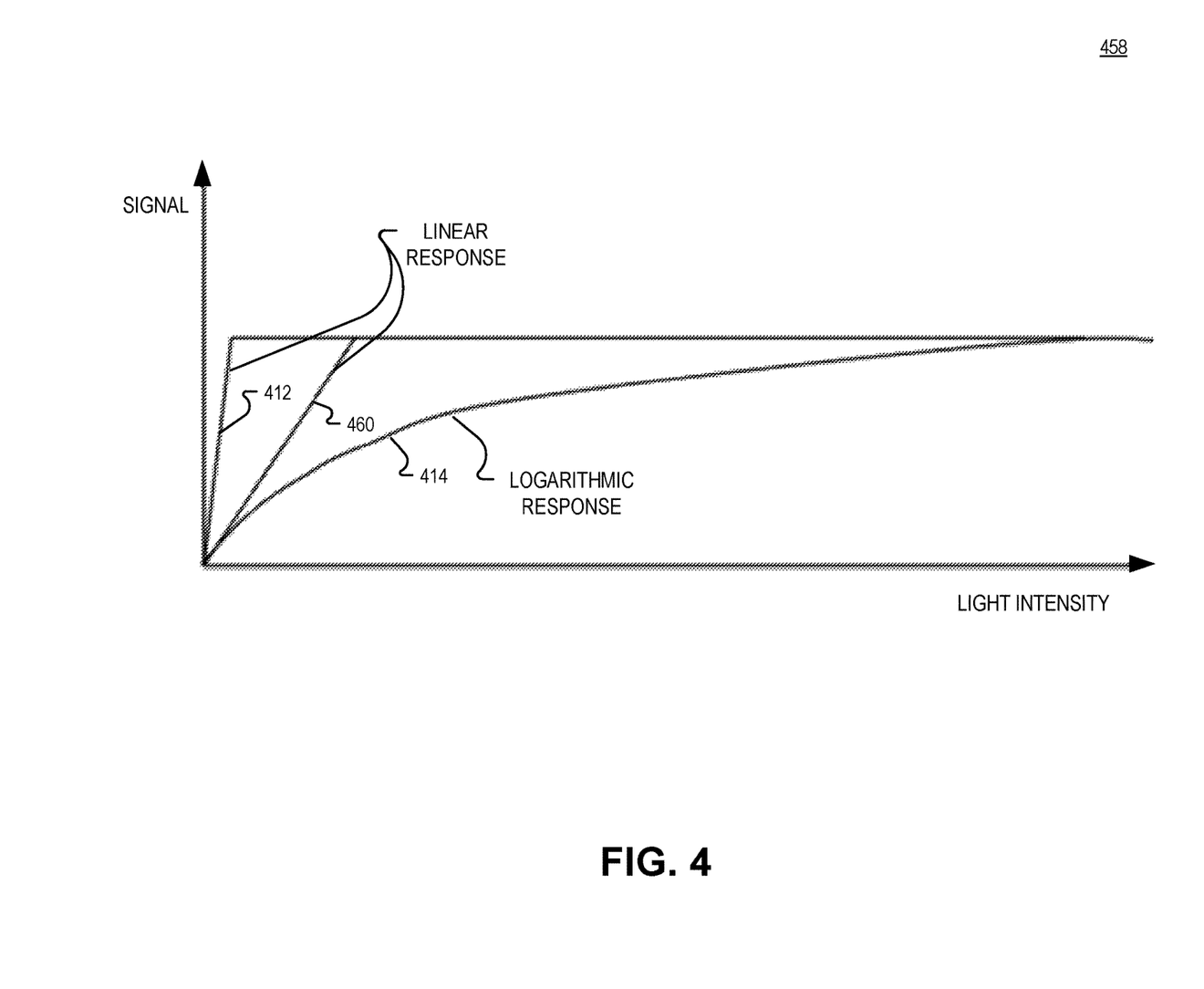
FIG. 4 is a diagram illustrating one example of the signal response relative to light intensity of example HDR pixel circuitry of an image sensor in which each pixel of a pixel array has a linear subpixel and a logarithmic subpixel in accordance with the teachings of the present invention.

FIG. 4 is a diagram 458 illustrating one example of signal response relative to light intensity of example HDR pixel circuitry of an image sensor in which each pixel of a pixel array has a linear subpixel and a logarithmic subpixel in accordance with the teachings of the present invention. In particular, the diagram 458 illustrates signal strength along the vertical axis with respect to light intensity along the horizontal axis. In the depicted example, a linear output signal 412 is shown to provide an example illustration of the signal strength the linear output signal of a linear subpixel, such as for example linear subpixel 112 of FIG. 1, linear subpixel 212 of FIG. 2, and/or linear subpixel 312 of FIG. 3. Similarly, a log output signal 414 is shown to provide an example illustration of the signal strength the log output signal of a log subpixel, such as for example log subpixel 114 of FIG. 1, log subpixel 214 of FIG. 2, and/or log subpixel 314 of FIG. 3. As can be appreciated from the depicted example, linear output signal 412 is linearly responsive to the light intensity of incident light, and log output signal 414 is logarithmically responsive to the light intensity of incident light.

For purposes of comparison, it is noted that an example signal 460 is also illustrated in FIG. 4. In the example, signal 460 depicts the example signal response of a hypothetical linearly responsive photodiode having the same smaller light exposure area on the incident plane as log subpixel 114 of FIG. 1, log subpixel 214 of FIG. 2, and/or log subpixel 314 of FIG. 3. As can be appreciated, the combination of a linear subpixel and a log subpixel (e.g., combination of signal 412 and 414) provide a dynamic range that is approximately 1000 times greater than the dynamic range of a single linear pixel (e.g., signal 412 alone) in accordance with the teachings of the present invention, whereas the combination of a larger light exposure area linear subpixel and a smaller light exposure area linear subpixel (e.g., combination of signal 412 and signal 460) provide a dynamic range that is only approximately 10 times greater than the dynamic range of the single linear pixel (e.g., signal 412 alone) in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel array for use in a high dynamic range image sensor, comprising:
    a plurality of pixels arranged in a plurality of rows and columns in the pixel array, wherein each one of the pixels comprises:
        a linear subpixel disposed in a semiconductor material, wherein the linear subpixel is coupled to generate a linear output signal having a linear response in response to incident light, wherein the linear subpixel includes a first photodiode disposed in the semiconductor material;
        a log subpixel disposed in the semiconductor material, wherein the log subpixel is coupled to generate a log output signal having a logarithmic response in response to the incident light, wherein the log subpixel includes a second photodiode disposed in the semiconductor material, wherein the first and second photodiodes are illuminated with the incident light directed through an incident plane of the semiconductor material, wherein a first area occupied by the first photodiode on the incident plane is greater than a second area occupied by the second photodiode on the incident plane;
    a plurality of first lenses, wherein each linear subpixel has one of the plurality of first lenses disposed proximate to the linear subpixel such that the incident light is directed through the one of the first lenses to the first photodiode;
    a plurality of second lenses different from the plurality of first lenses, wherein each log subpixel has one of the plurality of second lenses disposed proximate to the log subpixel such that the incident light is directed through the one of the second lenses to the second photodiode; and a plurality of bitlines coupled to the plurality of pixels, wherein each one of the plurality of bitlines is coupled to a corresponding grouping of the plurality of pixels, wherein each bitline is coupled to both the linear subpixel and the log subpixel of the corresponding grouping of the plurality of pixels to receive the linear output signal and the log output signal.

2. The pixel array of claim 1, wherein said each one of the plurality of bitlines is a column bitline, and wherein the corresponding grouping of the plurality of pixels is a column of the pixel array.

3. The pixel array of claim 1, wherein a ratio of a number of linear subpixels to a number of log subpixels in the pixel array is 1:1.

4. The pixel array of claim 1, wherein the linear subpixels and the log subpixels of the plurality of pixels are arranged in a square lattice pattern in the pixel array so that the log subpixel is substantially square and the linear subpixel is substantially octagonal.

5. The pixel array of claim 1, further comprising a color filter array disposed over the plurality of pixels, wherein each one of the plurality of pixels has a same color filter over the linear subpixel and the log subpixel.

6. The pixel array of claim 1, wherein the incident plane is on a backside of the semiconductor material.

7. The pixel array of claim 1, wherein linear subpixel support circuitry is coupled to the first photodiode, wherein log subpixel support circuitry is coupled to the second photodiode, wherein the linear subpixel support circuitry and log subpixel support circuitry are disposed proximate to a circuit plane of the semiconductor material.

8. The pixel array of claim 7, wherein the circuit plane is proximate to a front side of the semiconductor material.

9. The pixel array of claim 1, wherein the linear subpixel comprises:
the first photodiode coupled to generate first image charge in response to the incident light;
a transmit transistor coupled to the first photodiode to transfer the first image charge from the first photodiode to a floating diffusion in response to a transmit signal;
a first reset transistor coupled to the floating diffusion to reset the floating diffusion in response to a reset signal;
a first amplifier coupled to the floating diffusion to generate the linear output signal in response to the first image charge; and
a first row select transistor coupled between the first amplifier and the bitline to output the linear output signal to the bitline in response to a row select signal.

10. The pixel array of claim 1, wherein the log subpixel comprises:
the second photodiode coupled to generate second image charge in response to the incident light;
a second reset transistor coupled to the second photodiode to reset the second photodiode in response to a reset signal;
a second amplifier coupled to the second photodiode:
a third amplifier coupled to the second amplifier to generate the log output signal in response to the second image charge; and
a second row select transistor coupled between the third amplifier and the bitline to output the log output signal to the bitline in response to a row select signal.

11. A high dynamic range (HDR) imaging system, comprising:
a pixel array including a plurality of pixels arranged in a plurality of rows and columns in the pixel array, wherein each one of the pixels comprises:
a linear subpixel disposed in a semiconductor material, wherein the linear subpixel is coupled to generate a linear output signal having a linear response in response to incident light, wherein the linear subpixel includes a first photodiode disposed in the semiconductor material; and
a log subpixel disposed in the semiconductor material, wherein the log subpixel is coupled to generate a log output signal having a logarithmic response in response to the incident light, wherein the log subpixel includes a second photodiode disposed in the semiconductor material, wherein the first and second photodiodes are illuminated with the incident light directed through an incident plane of the semiconductor material, wherein a first area occupied by the first photodiode on the incident plane is greater than a second area occupied by the second photodiode on the incident plane;
a plurality of first lenses, wherein each linear subpixel has one of the plurality of first lenses disposed proximate to the linear subpixel such that the incident light is directed through the one of the first lenses to the first photodiode;
a plurality of second lenses different from the plurality of first lenses, wherein each log subpixel has one of the plurality of second lenses disposed proximate to the log subpixel such that the incident light is directed through the one of the second lenses to the second photodiode; and
a plurality of bitlines coupled to the plurality of pixels, wherein each one of the plurality of bitlines is coupled to a corresponding grouping of the plurality of pixels, wherein each bitline is coupled to both the linear subpixel and the log subpixel of the corresponding grouping of the plurality of pixels to receive the linear output signal and the log output signal;
control circuitry coupled to the pixel array to control operation of the pixel array; and
readout circuitry coupled to the pixel array to readout the linear output signals and the log output signals from the plurality of pixels.

12. The HDR imaging system of claim 11, further comprising function circuitry coupled to the readout circuitry to store image data in response to the linear output signals and the log output signals from the plurality of pixels.

13. The HDR imaging system of claim 11, wherein said each one of the plurality of bitlines is a column bitline, and wherein the corresponding grouping of the plurality of pixels is a column of the pixel array.

14. The HDR imaging system of claim 11, wherein a ratio of a number of linear subpixels to a number of log subpixels in the pixel array is 1:1.

15. The HDR imaging system of claim 11, wherein the linear subpixels and the log subpixels of the plurality of pixels are arranged in a square lattice pattern in the pixel array.

16. The HDR imaging system of claim 11, further comprising a color filter array disposed over the plurality of pixels, wherein each one of the plurality of pixels has a same color filter over the linear subpixel and the log subpixel.

17. The HDR imaging system of claim 11, wherein the incident plane is on a backside of the semiconductor material.

18. The HDR imaging system of claim 11, wherein linear subpixel support circuitry is coupled to the first photodiode, wherein log subpixel support circuitry is coupled to the second photodiode, wherein the linear subpixel support circuitry and log support circuitry are disposed proximate to a circuit plane of the semiconductor material.

19. The HDR imaging system of claim 18, wherein the circuit plane is proximate to a front side of the semiconductor material.

20. The pixel array of claim 4, wherein one of four edges of the log subpixel is substantially parallel, and substantially equal in length, to one of eight edges of the linear subpixel.

* * * * *